(12) United States Patent
Grant et al.

(10) Patent No.: US 6,423,619 B1
(45) Date of Patent: Jul. 23, 2002

(54) TRANSISTOR METAL GATE STRUCTURE THAT MINIMIZES NON-PLANARITY EFFECTS AND METHOD OF FORMATION

(75) Inventors: John M. Grant; Olubunmi O. Adetutu, both of Austin; Yolanda S. Musgrove, Pflugerville, all of TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/997,899

(22) Filed: Nov. 30, 2001

(51) Int. Cl.7 .......................................... H01L 21/3205
(52) U.S. Cl. ...................... 438/589; 438/272; 257/330; 257/334
(58) Field of Search .................. 438/589, 584–588, 438/592, 591, 593, 197, 200, 270, 271, 800; 257/330, 331–334, 797

(56) References Cited

U.S. PATENT DOCUMENTS

| | | |
|---|---|---|
| 5,364,817 A | 11/1994 | Lur et al. |
| 5,674,781 A | 10/1997 | Huang et al. |
| 6,087,231 A | 7/2000 | Xiang et al. |
| 6,140,224 A | 10/2000 | Lin |
| 6,150,260 A | 11/2000 | Roy |
| 6,171,910 B1 | 1/2001 | Hobbs et al. |
| 6,200,886 B1 | 3/2001 | Yu et al. |
| 6,221,721 B1 * | 4/2001 | Takahashi .................. 438/270 |
| 6,285,073 B1 | 9/2001 | Cooper et al. |

* cited by examiner

Primary Examiner—Craig Thompson
(74) Attorney, Agent, or Firm—Kim-Marie Vo; Robert L. King

(57) ABSTRACT

A metal gate structure is formed by depositing a gate dielectric, a gate electrode, a stop layer, and a metal layer within a gate trench and removing the portions of the layers that lie outside the gate trench. A first polish or etch process is used to remove a portion of the metal layer selective to the stop layer. A second polish or etch process is used to remove portions of the gate dielectric, the gate electrode, the stop layer and the metal layer which lie outside the gate trench after the first polish or etch process. The resulting structure increases the uniformity and non-planarity of the top surface of the metal gate structure.

20 Claims, 2 Drawing Sheets

TRANSISTOR METAL GATE STRUCTURE THAT MINIMIZES NON-PLANARITY EFFECTS AND METHOD OF FORMATION

FIELD OF THE INVENTION

The present invention is related to semiconductor devices and, more specifically, to a transistor metal gate structure that minimizes non-planarity effects.

BACKGROUND

As used herein, the term "high-k material" or "high dielectric constant material" refers to any material with a dielectric constant that is greater than silicon dioxide. The dielectric constant of silicon dioxide is approximately 3.9.

As the industry moves to high dielectric constant materials due to electrical problems of using a thin silicon dioxide layer, using polysilicon as a gate electrode can result in the depletion of carriers in the polysilicon gate. To alleviate the polysilicon depletion problem, metal gate structures can be used.

One method used to form transistor metal gate structures includes depositing metal layers within a gate trench, meaning a trench where a gate will subsequently be formed, and along the top surface of insulating materials surrounding the gate trench. An etch back or polishing process is used to remove the portions of the metal layers lying outside the gate trench.

When removing the metal layers using chemical mechanical polishing (CMP), dishing can occur across the semiconductor wafer and when using etch back the insulating materials around the gate trench can erode. This results in non-functional devices, which decreases yield. Therefore, there is a need for a semiconductor process that minimizes non-planarity effects when removing the metal layers outside the gate trench.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

A control electrode dielectric layer is formed adjoining all surfaces of a control electrode trench and extending beyond the control electrode trench. A control electrode layer is formed adjoining the control electrode dielectric layer in the control electrode trench. A stop layer is formed within the control electrode trench over the control electrode dielectric layer. Both the control electrode layer and the stop layer fill less than all of the control electrode trench. A conductive layer is formed adjoining all exposed surfaces of the stop layer and extending beyond the gate trench and substantially filling all the remaining volume of the control electrode trench. The control electrode dielectric layer, the control electrode layer, the stop layer and the conductive layer form a control electrode stack overlying a channel area in a substrate and having a lateral dimension and a height defining the control electrode trench that is determined by a sidewall spacer.

Portions of the conductive layer above the stop layer are removed using the stop layer to substantially retard the removing. The stop layer is a conductive material that has a slower removal rate than the overlying materials during removal of the overlying materials. All portions of the conductive layer, the stop layer, the control electrode layer, and the control electrode dielectric above a predetermined height are also removed. The invention is better understood by turning to the figures and is defined by the claims.

Figure 1:
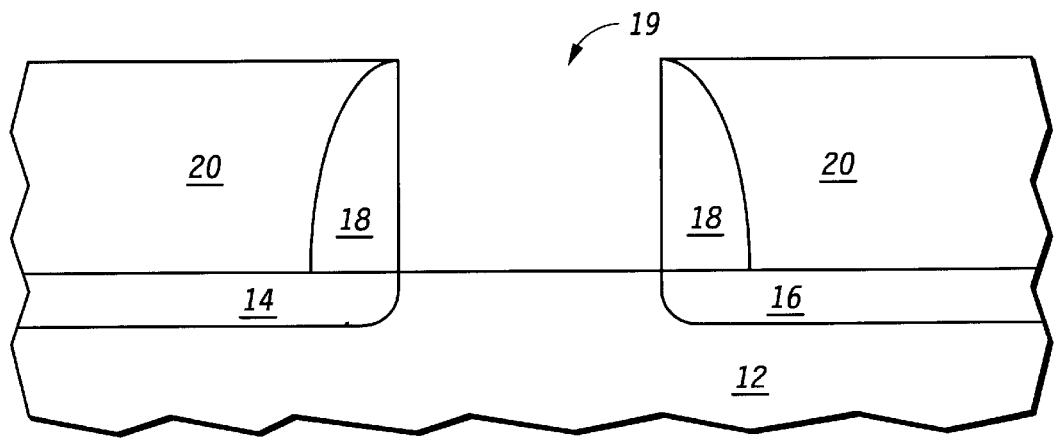
FIG. 1 illustrates a cross-sectional view of a semiconductor device after removing the dummy gate in a replacement gate integration in accordance with an embodiment of the present invention.

FIG. 1 illustrates a cross-section of a semiconductor device or integrated circuit 10 including a semiconductor substrate 12, a source region 14, a drain region 16, sidewall spacers 18 and an interlevel dielectric layer (ILD) 20 after removing a dummy gate stack to form a gate trench 19 in a replacement gate integration, as known to a skilled artisan. The semiconductor substrate 12 can be any semiconductor material such as silicon, gallium arsenide, silicon germanium and the like. In addition the semiconductor substrate 12 can be the silicon layer of a silicon-on-insulator (SOI) substrate. The source region 14 and the drain region 16 are doped a conductivity that is opposite that of the semiconductor substrate 12, if doped, and are separated from each other to define a channel area in the semiconductor substrate 12. The sidewall spacers 18 are insulating and, preferably, include a nitride or oxide material. In one embodiment, the sidewall spacers 18 are a stack of insulating materials. The ILD layer 20 is an insulating material, such as silicon dioxide, and can also include a stack of insulating materials. The ILD layer 20 adjoins an outer perimeter of the sidewall spacers and will insulate the subsequently formed transistor structure.

Figure 2:
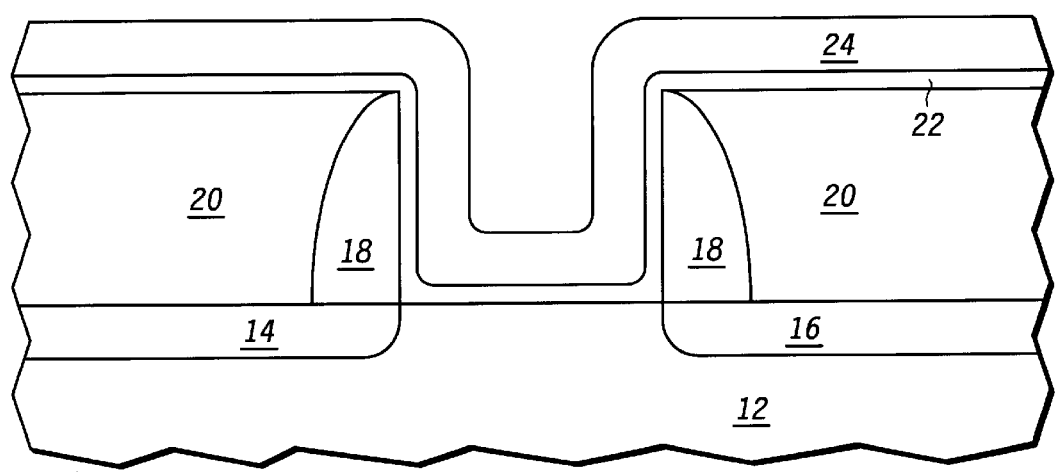
FIG. 2 illustrates the semiconductor device in FIG. 1 after depositing a gate dielectric and a gate electrode in accordance with an embodiment of the present invention.

As shown in FIG. 2, a gate dielectric or control electrode dielectric 22 and a gate electrode 24 are formed in the gate trench 19 and along the upper surface of the ILD LAYER 20 by CVD (chemical vapor deposition), PVD (physical vapor deposition), ALD (atomic layer deposition), MBE (molecular beam epitaxy), plating, combinations of the above or the like. However, it is not necessary that the gate dielectric layer 22 and the gate electrode 24 be formed by the same process. The gate dielectric layer 22 can be any dielectric material, such as silicon dioxide, a high-k material, a metal-oxy-nitride, a metal oxide, a metal silicate, or a metal aluminate. For example, the gate dielectric layer 22 can be silicon nitride, silicon dioxide, $HfO_2$, $ZrO_2$, $HfSi_xO_y$, $SiO_xN_y$, and the like. Typically, the gate dielectric layer 22 is approximately 10 Angstroms to 60 Angstroms.

The gate electrode or current electrode 24 can be a metal nitride (such as TiN, TaN, TiSiN, TaSiN), a conductive metal oxide (such as IrO, RuO, or a metal aluminum nitride (such as $Ti_xAl_yN_z$), a metal silicide, a metal-silicon-nitride, or any other material that has a suitable work function. A suitable work function is a material property that determines the desired threshold voltage value for the transistor. In one embodiment, the gate electrode 24 will be a thickness that is less than half of the gate length of the transistor and greater than 10 Angstroms.

Figure 3:
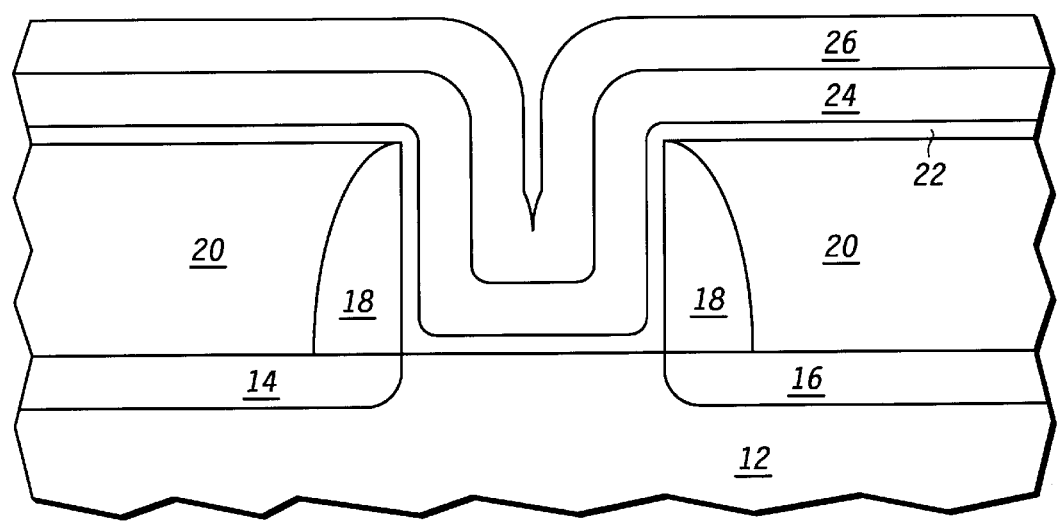
FIG. 3 illustrates the semiconductor device in FIG. 2 after depositing a stop layer in accordance with an embodiment of the present invention.

After forming the gate dielectric layer 22 and the gate electrode 24, a stop layer 26 is formed, by CVD, PVD, ALD, MBE, plating, the like, or combinations of the above, as shown in FIG. 3. The stop layer 26 is conductive and can be a pure metal (such as Ti, Ta, Ag, Au, Ir or Ru), a metal silicide (such as cobalt silicide or titanium silicide), or silicon. The stop layer 26 can serve as an etch stop layer and/or a polish stop layer for the subsequently formed overlying layers. The stop layer 26 can be a polish stop layer for a chemical mechanical polish (CMP) or a physical mechanical polish of the overlying materials. In an embodiment where the stop layer 26 is a polish stop layer, a thickness of 50 Angstroms has shown to be sufficient using conventional CMP equipment. When serving as an etch stop layer, the stop layer 26 can be a stop layer for a chemical etch back of the overlying materials.

Figure 4:
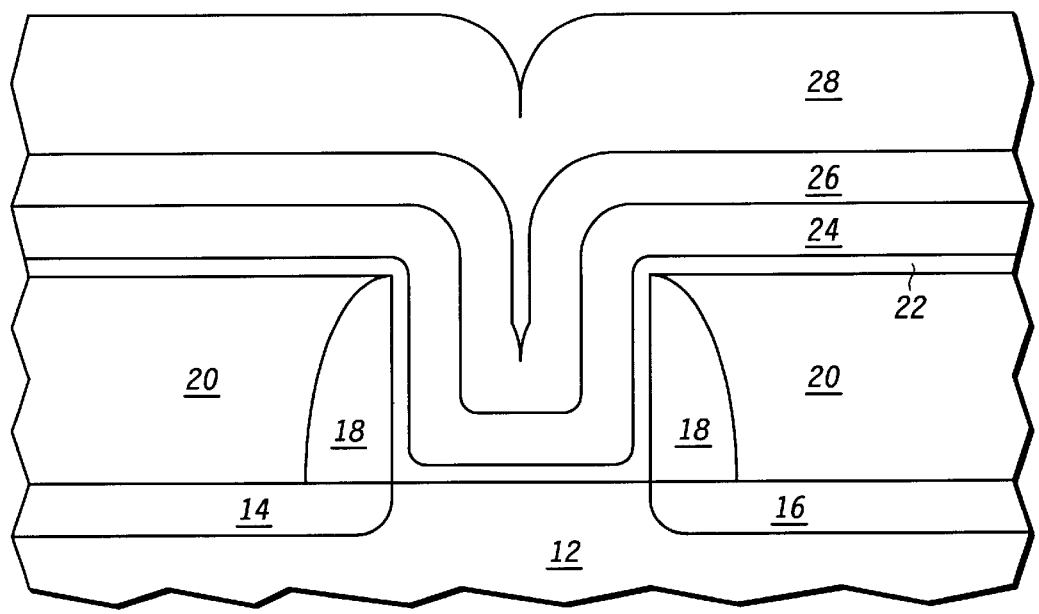
FIG. 4 illustrates the semiconductor device in FIG. 3 after depositing a metal layer in accordance with an embodiment of the present invention.

As shown in FIG. 4, after forming the stop layer 26, a conductive layer 28 is formed over the semiconductor device 10 by CVD, PVD, ALD, MBE, plating, the like or combinations of the above. The conductive layer 28 is a conductive material with a low resistivity and can be a metal (such as W, Al, Au, Cu, Ag, Pt), a metal silicide or silicon, the like, or combinations of metals. The conductive layer 28 should be able to be polished or etched selectively to the stop layer 26 material. The conductive layer 28 is thicker than the sum total of the thicknesses of the stop layer 26, the gate electrode layer 24 and the gate dielectric layer 22. Therefore, the stop layer 26, the gate electrode layer 24, and the gate dielectric layer 22 are thinner than the conductive layer 28. In one embodiment, the thickness of the conductive layer 28 is approximately twice the depth of the gate trench 19.

Figure 5:
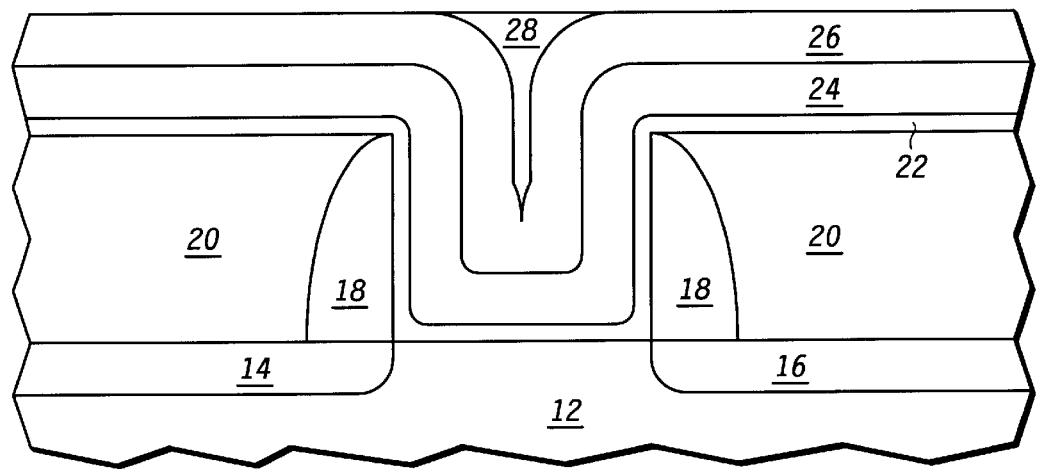
FIG. 5 illustrates the semiconductor device in FIG. 4 after removing portions of the metal layer in accordance with an embodiment of the present invention.

After forming the conductive layer 28, a portion of the conductive layer 28 is polished or etched until the stop layer 26 is exposed as shown in FIG. 5. This is performed by using a process that is selective to the material chosen for the stop layer 26. For example, if the conductive layer 28 is tungsten and the stop layer 26 is titanium a CMP chemistry using $FeNO_3$ can be used. The chemistry used to remove materials suitable for the conductive layer 28 tends to not be selective to metal nitrides or other gate electrode type materials, however, the chemistry is selective to materials disclosed for the stop layer 26.

Figure 6:
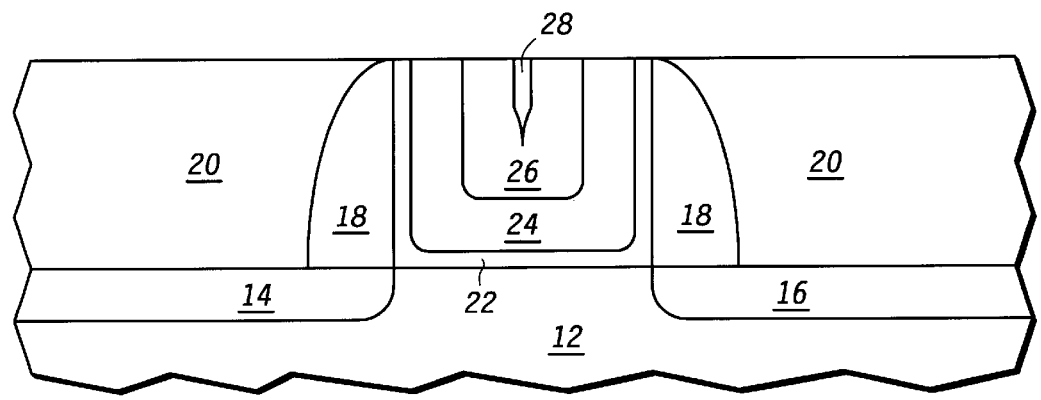
FIG. 6 illustrates the semiconductor device in FIG. 5 after removing portions of the metal layer, the stop layer, the gate electrode layer and the gate dielectric in accordance with an embodiment of the present invention.

Shown in FIG. 6, after removing the portion of the conductive layer 28 that lies over the etch stop layer 28, a different polish or etch process is performed to remove the stop layer 26, the gate electrode layer 24 and the gate dielectric layer 22. The ILD LAYER 20 will serve as a second stop material for the selective layer removal of overlying materials. For example, if the conductive layer 28 is removed by CMP, the semiconductor device 10 can be switched to a different platen in the CMP tool with a different slurry and pad to remove the stop layer 26, the gate electrode layer 24 and the gate dielectric layer 22 selective to the ILD LAYER 20. For example, a chemistry using ammonium hydroxide can be used to CMP the three layers 26, 24, and 22. However, it is not necessary that the stop layer 26, the gate electrode layer 24 and the gate dielectric layer 22 be removed using the same chemistry or during the same process step. Therefore, more than one process chemistry and step can be performed to remove the layers 26, 24 and 22.

The resulting structure after removing the portions of the gate electrode stack or control electrode stack—which includes the conductive layer 28, the stop layer 26, the gate electrode layer 24, and the gate dielectric layer 22—that are over the ILD LAYER 20 is a transistor metal gate structure with a minimum dishing or recessing of the gate or control electrode stack. The dishing of the ILD LAYER 20 is also minimized in other areas of the semiconductor substrate 12 (not shown). Advantageously, yield is increased due to the decrease in dishing. The presence of the stop layer 26 allows for at least a two-step polish or etch process to be performed. Since it is generally more difficult to polish or etch a thicker layer than a thinner layer with good uniformity across a die or a wafer, the ability to remove the thicker layer selective to underlying thinner layers by stopping on a stop layer and subsequently removing the thinner layers using a separate process increases planarity control.

Another advantage of the invention is that it allows for the selection of the gate electrode material independently of its polishing or etching characteristics. Therefore, the present invention provides for a wider range of choices for the gate electrode material than if the stop layer 26 is not used.

After forming a transistor metal gate with minimized non-planarity, traditional additional processing (not shown) known to one skilled in the art is performed. For example, a second ILD material is deposited over the structure shown in FIG. 6 and metal interconnects are subsequently formed.

In the foregoing specification, the invention has been described with reference to specific embodiments. However, one of ordinary skill in the art appreciates that various modifications and changes can be made without departing from the scope of the present invention as set forth in the claims below. For example, additional layers may be incorporated into the gate electrode stack, such as diffusion or barrier layers. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A transistor structure comprising:
    a substrate having first and second current electrodes formed therein and separated to define a channel area in the substrate;
    a control electrode stack overlying the channel area in the substrate, the control electrode stack having a lateral dimension determined by a sidewall spacer and having a height to define a control electrode trench, the control electrode stack further comprising:
        a control electrode dielectric directly adjoining the sidewall spacer and a region above the channel area, the control electrode dielectric filling a first portion of the control electrode trench;

a control electrode layer directly adjoining the control electrode dielectric, the control electrode layer filling a second portion of the control electrode trench and having a material property that determines a threshold voltage value of the transistor structure;

a conductive stop layer directly adjoining the control electrode layer, the conductive stop layer filling a third portion of the control electrode trench and providing a stop material that is used for selective layer removal of overlying materials during formation of the transistor structure; and a conductive layer directly adjoining the conductive stop layer, the conductive layer filling a fourth portion of the control electrode trench, the first portion, second portion, third portion and fourth portion substantially filling the control electrode trench.

2. The transistor structure of claim 1 wherein the conductive stop layer is a polish stop layer for a chemical mechanical polish of the overlying materials.

3. The transistor structure of claim 1 wherein the conductive stop layer is a polish stop layer for a physical mechanical polish of the overlying materials.

4. The transistor structure of claim 1 wherein the conductive stop layer is an etch stop layer for chemical etch back of the overlying materials.

5. The transistor structure of claim 1 wherein the control electrode dielectric comprises one of a material selected from a group consisting of silicon dioxide, silicon-oxy-nitride, silicon nitride, metal silicates, metal aluminates, metal oxides and metal-oxy-nitrides.

6. The transistor structure of claim 1 wherein the control electrode layer comprises one a material selected from a group consisting of: metal nitrides, metal silicides, metal-silicon-nitrides, metal-aluminum-nitride and conductive metal oxides.

7. The transistor structure of claim 1 wherein the conductive stop layer comprises a conductive material that has a slower removal rate than the overlying materials during removal of the overlying materials.

8. The transistor structure of claim 7 wherein the conductive stop layer comprises a metal, a metal silicide or silicon.

9. The transistor structure of claim 1 wherein the conductive layer comprises a metal.

10. The transistor structure of claim 9 wherein the metal comprises a material selected from a group consisting of: tungsten, aluminum, gold, copper and silver.

11. The transistor structure of claim 1 further comprising:

an interlevel dielectric adjoining an outer perimeter of the sidewall spacer, the interlevel dielectric electrically insulating the transistor structure and providing a second stop material for the selective layer removal of overlying materials.

12. A method for providing a transistor, comprising:

providing a substrate;

forming first and second current electrodes in the substrate, the first and second current electrodes being separated to define a channel area in the substrate;

forming a control electrode trench that determines location of a control electrode; and forming a control electrode stack within the control electrode trench, the forming of the control electrode stack further comprising:

forming a control electrode dielectric within and beyond the control electrode trench and directly adjoining walls of the control electrode trench, the control electrode dielectric filling a first portion of the control electrode trench;

forming a control electrode layer directly adjoining the control electrode dielectric, the control electrode layer filling a second portion of the control electrode trench and having a material property that determines a threshold voltage value of the transistor;

forming a conductive stop layer directly adjoining the control electrode layer, the conductive stop layer filling a third portion of the control electrode trench and providing a stop material that is used for selective layer removal of overlying materials during formation of the transistor;

forming a conductive layer directly adjoining the conductive stop layer, the conductive layer filling a fourth portion of the control electrode trench, the first portion, second portion, third portion and fourth portion substantially filling the control electrode trench opening;

removing a first initial part of the conductive layer to form a first upper surface by using the conductive stop layer to stop the removing; and removing a second initial part of the conductive layer and part of the conductive stop layer, the control electrode layer and the control electrode dielectric to form a control electrode stack of the transistor that has a substantially planar upper surface.

13. The method of claim 12 further comprising:

forming an interlevel dielectric adjoining an outer perimeter of the control electrode trench, the interlevel dielectric electrically insulating the transistor; and using the interlevel dielectric as a second stop material to remove the second initial part of the conductive layer and part of the conductive stop layer, the control electrode layer and the control electrode dielectric.

14. The method of claim 12 further comprising:

forming the control electrode layer with a material selected from a group consisting of: metal nitrides, metal suicides, metal-silicon-nitrides, metal-aluminum-nitride and conductive metal oxides.

15. The method of claim 12 further comprising:

forming the conductive stop layer with a conductive material that has a slower removal rate than the overlying materials during removal of the first initial part of the conductive layer.

16. A method of forming within a gate trench a metal gate structure that minimizes non-planarity effects comprising:

forming a gate dielectric adjoining all surfaces of the gate trench and extending beyond the gate trench;

forming a gate electrode layer of a first metal adjoining the gate dielectric and extending beyond the gate trench, the gate electrode layer filling less than all of the gate trench;

forming a stop layer adjoining all exposed surfaces of the gate electrode layer and extending beyond the gate trench, the stop layer also filling less than all of the gate trench;

forming a conductive layer of a second metal adjoining all exposed surfaces of the stop layer and extending beyond the gate trench, the conductive layer substantially filling the gate trench;

removing all portions of the conductive layer above the stop layer by using the stop layer to substantially retard the removing; and removing all portions of the conductive layer, the stop layer, the gate electrode layer and the gate dielectric above a predetermined height.

17. The method of claim 16 further comprising:
removing any of the conductive layer of the second metal, the stop layer, the gate electrode layer and the gate dielectric by one of the following removal techniques consisting of chemical mechanical polishing (CMP), mechanical polishing, chemical polishing, etch-back processing, or sputter removal.

18. The method of claim 16 wherein each of forming the gate dielectric, the gate electrode layer, forming the stop layer and forming the conductive layer further comprises forming each of the gate dielectric, the gate electrode layer, the stop layer and the conductive layer by depositing by any of either physical vapor deposition (PVD), atomic layer deposition (ALD), chemical vapor deposition (CVD), molecular beam epitaxy (MBE) or plating.

19. The method of claim 16 wherein the step of forming the gate electrode layer further comprises forming the gate electrode layer from a material selected from a group consisting of titanium nitride, tantalum nitride, titanium silicon nitride, tantalum silicon nitride, iridium oxide, ruthenium oxide, tungsten nitride, tungsten silicon nitride and titanium aluminum nitride.

20. The method of claim 16 wherein the step of forming the stop layer further comprises forming the stop layer from a material selected from a group consisting of titanium, tantalum, silicon, gold and silver.

* * * * *

UNITED STATES PATENT AND TRADEMARK OFFICE
CERTIFICATE OF CORRECTION

PATENT NO. : 6,423,619 B1
DATED : July 23, 2002
INVENTOR(S) : John M. Grant et al.

It is certified that error appears in the above-identified patent and that said Letters Patent is hereby corrected as shown below:

Column 6,
Line 38, change "suicides" to -- silicides --.

Signed and Sealed this

Twenty-second Day of April, 2003

JAMES E. ROGAN
*Director of the United States Patent and Trademark Office*